United States Patent [19]

Tigges et al.

[11] Patent Number: 4,757,213
[45] Date of Patent: Jul. 12, 1988

[54] NON-CONTACT OPERATING PROXIMITY SWITCH

[75] Inventors: Burkhard Tigges, Sundern; Dierk Brasse, Schalksmühle, both of Fed. Rep. of Germany

[73] Assignee: Werner Turch GmbH & Co. KG, Halver, Fed. Rep. of Germany

[21] Appl. No.: 49,936

[22] Filed: May 15, 1987

[30] Foreign Application Priority Data

May 15, 1986 [DE] Fed. Rep. of Germany ....... 3616389

[51] Int. Cl.$^4$ .............................................. H05K 5/00
[52] U.S. Cl. ..................................... 307/116; 307/115; 361/179; 340/310 R; 174/50; 174/52 R
[58] Field of Search ............... 307/112, 113, 114, 115, 307/116, 117; 200/19 L, 19 M, 67 F, 64, 61.45 M, 61.54, 61.67, 61.68; 361/179, 180, 183, 203, 204, 206; 340/547, 551, 552, 567; 70/276, 277, 439; 324/160, 173, 174, 179, 166, 162, 163, 164, 171; 174/50, 52 R

[56] References Cited

U.S. PATENT DOCUMENTS

| 3,454,869 | 7/1969 | Strauss et al. | 361/179 X |
| 3,818,306 | 6/1974 | Marini | 363/15 |
| 3,860,864 | 1/1975 | Fitz | 363/15 |
| 3,863,140 | 1/1975 | Easter et al. | 363/15 X |
| 4,090,091 | 5/1978 | Brown et al. | 307/116 |
| 4,212,053 | 7/1980 | Sichenzia | 363/16 X |
| 4,349,814 | 9/1982 | Akehurst | 307/116 X |
| 4,419,646 | 12/1983 | Hermle | 307/116 X |
| 4,514,645 | 4/1985 | Endo et al. | 307/115 X |
| 4,552,987 | 11/1985 | Stebegg et al. | 361/179 X |
| 4,553,040 | 11/1985 | Truper et al. | 307/116 |
| 4,583,006 | 4/1986 | Okada et al. | 361/179 X |
| 4,639,714 | 1/1987 | Crowe | 340/310 R |
| 4,654,471 | 3/1987 | Masaki et al. | 361/179 X |
| 4,673,827 | 6/1987 | Sommer | 307/116 |

Primary Examiner—William M. Shoop, Jr.
Assistant Examiner—Paul Ip
Attorney, Agent, or Firm—Antonelli, Terry & Wands

[57] ABSTRACT

A proximity switch operating on a non-contact basis including a terminal-side main part set in a base housing and a sensor part set in a probe. To enable a selection of the response direction, the probe may be adjusted in different positions on the base housing, to which the probe is designed or arranged as a component insulated on all sides which, by way of individual in-built core coils is inductively coupled with a core coil set in the base housing.

3 Claims, 2 Drawing Sheets

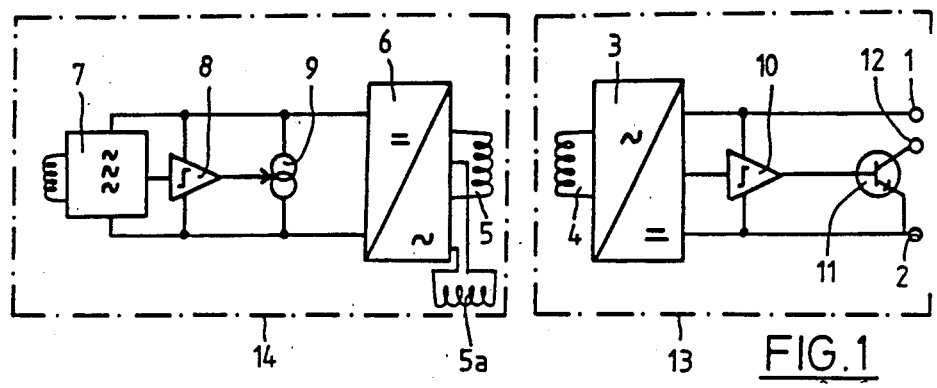
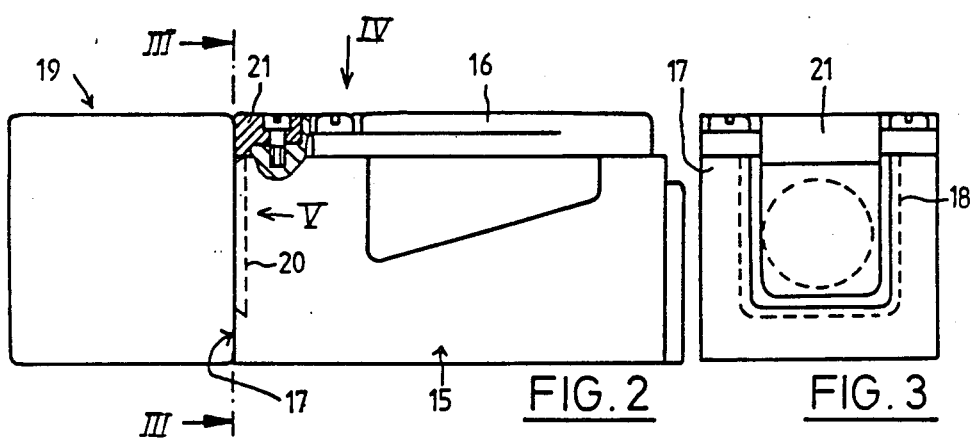
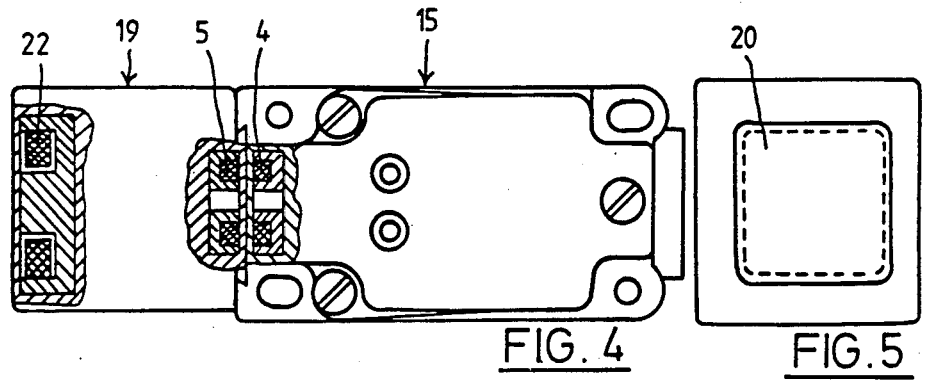

NON-CONTACT OPERATING PROXIMITY SWITCH

BACKGROUND OF THE INVENTION

The present invention relates to a proximity switch operable on a non-contact basis and includes a direct current circuit arrangement disposed between and input part and a sensor field producer which is divided into the terminal-side main part, set in a base housing, and a sensor part set in a probe, wherein the probe, for the purpose of selecting the direction of response, can be selectively set in different predetermined positions on the basic housing of the main part.

Non-contact proximity switches serve to trigger electrical switching operations when ever an object spatially approaches or moves away from the switching arrangement. In switches of the aforementioned type, it is principally the modifications, brought about by the approach of the electrically and/or magnetically conductive objects of electromagnetic fields for triggering the switching operations, that have been proposed. In a frequently utilized type of proximity switch, an oscillatory circuit is set into vibration or pulsation by an oscillator. The oscillation is influenced by an approach of electrically conductive objects toward the oscillatory circuit coil or toward a special coil maintained on course by the oscillator whereby, for example, the amplitude of the oscillation is changed by the resistance or the oscillation is entirely interrupted. An evaluation stage connected at the outlet side to the oscillator plots the status of oscillation and, by way of a controller notch, constructs a switching phase of the proximity switch. The output of the switching phase can thereby include contact control such as, for example, a closing of a switch, an opening of a switch, a reversing of a switch, or, in a defined semiconductor phase, such as, for example, a blocked or switched-through phase of a transistor, thyristor or triac, or in a defined signal level. In so-called dual wire proximity switches, the circuit conditions are determined in accordance with certain value ranges of current consumption by the proximity switches.

In all types of inductively operated proximity switches, the coil arrangement such as, for example, a sensor is provided wherein changes in the field are determined in order to form a switching phase. The geometric arrangement of the coils and associated magnetic circuit represents a decisive factor for any alterations of the proximity phase addressed by the proximity switch, that is, in particular from which direction the approach has to occur and the ranges for the change in switching phases.

In a similar manner, other inductively-operating proximity switches such as, for example, optical or capacitive operated proximity switches have also been proposed which include a special sensor arrangement the construction of which determines response direction and the value of the response.

The arrangement of a sensor is of particular importance for the practical application of proximity switches because, in addition to machines, there are often cramped space conditions to deal with which make it difficult for an addition of proximity switches in the required response direction. For this reason, a number of proposals have been made which are often differentiated only by a special arrangement of the sensor such as, for example, a proximity switch having a construction form which is otherwise identical to other proximity switches but being mounted on a front surface or on one of four lateral surfaces.

In, for example, German Pat. No. 2,817,020, to reduce the number of elements necessary to house the sensor arrangement, a square of tube-shaped body is mounted so as to be pivotable on a square or cyliner-shaped main piece or is mounted so that it is capable of being threaded on or plugged into or inserted in various positions. In this manner, the necessary electrical connections between the main piece and the senor part of the proximity switch can be established either by correspondingly movable electric leads or by plug contacts or loop contacts.

A disadvantage of the provision of movable electrical leads in resides in the fact that replacement of the sensor part is difficult because the electrical connections such as, for example, either solder or screw junctions, must be loosened. However, it is desireable to provide for an easy replacement whereby it is possible for the sensor part or parts to be replaced by sensor parts with different response values or response times or by sensor parts having a different principle function when a replacement is necessary due to, for example, mechanical damage. In the event of frequent changing of the response direction by, for example, twisting or turning the sensor part, a fatigue or breakage of the movable leads and their contact points can readily occur.

Employing plug or loop contacts, the construction is, as a rule, somewhat expensive and it is particularly difficult in previously proposed constructions to establish a satisfactory caulking for the connection points that will seal out contaminants such as dirt and liquids. Moreover, the contact points tend to oxidate and corrode thereby lowering the reliability of the proposed plug or loop contact arrangements.

The aim underlying the present invention essentially resides in providing a proximity switch which includes a sensor part which is readily movable and replaceable in a simple and convenient manner.

According to advantageous features of the present invention, a proximity switch is provided wherein a probe thereof is insulated on all sides and a part of the sensor switch as a direct current/alternating current transformer with a follow-on core coil, and with the sensor part having an alternating current/direct current transformer with an aligned core coil. The core coils lie behind each of the fastening sides of a base housing and the probe and, when the probe is released, the energy is release transferred by an inductive coupling from the main part to the sensor part and the signals from the sensor part to the main part.

By virtue of the above noted features of the present invention, it is possible to avoid the disadvantages and problems encountered in the prior art which result from an electrical connection of the main part and the probe. In this connection, even in the probe there is a direct current supply so that the circuit, with respect to an evaluation accuracy, degree of amplification, etc., can be appropriately set up.

In accordance with the present invention, the probe may have a cube-shape and include a fastening side disposed adjacent to a response side and a fastening side disposed across from the response side with a core coil being mounted on each of the fastening sides and both being attached to the same AC-DC transformer.

In accordance with further features of the present invention, the base housing or the main part may be provided with a dovetail extension pocket on a fastener side and a probe having, on each of one or two of the cube sides, a quadratic head undercut on all sides which may be slipped or inserted into the dovetail suspension pocket.

Advantageously, in accordance with the present invention, an open end of the dovetail suspension pocket may be closed off by a threaded pressure plate.

The above and other objects, features, and advantages of the present invention will become more apparent from the following description when taken in connection with the accompanying drawings which show, for the purpose of illustration only, several embodiments in accordance with the present invention.

BRIEF DESCRIPTION OF THE DRAWINGS

FIG. 1 is a schematic circular diagram of a proximity switch constructed in accordance with the present invention;

FIG. 2 is a partial cross-sectional view of a first embodiment of a mechanical construction of a proximity switch in accordance with the present invention;

FIG. 3 is a view taken along the line III—III in FIG. 2;

FIG. 4 is a partial cross-sectional top view of the embodiment of FIG. 2 taken in the direction of the arrow IV in FIG. 2;

FIG. 5 is a front view of the embodiment of FIG. 2 viewed in the direction of the arrow V;

DETAILED DESCRIPTION

Figure 6:
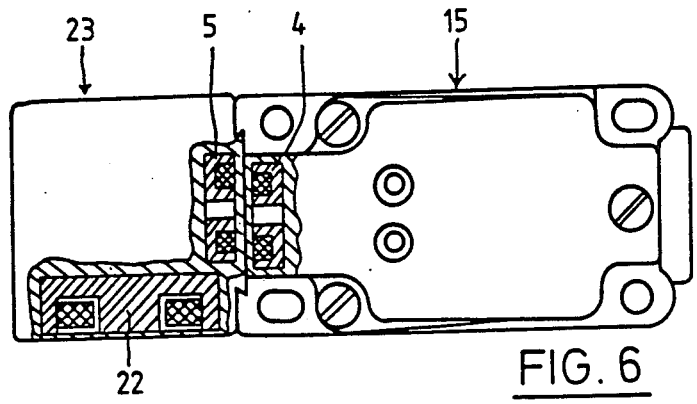
FIG. 6 is a partial cross-sectional view of another embodiment constructed in accordance with the present invention.

Referring now to the drawings wherein like reference numerals are used throughout the various views to designate like parts and, more particularly, to FIG. 1, according to this figure, from a direct voltage supply supplied to the terminals 1, 2, an alternating current voltage is produced by a direct current/alternating current transformer 3 in the form of a DC/AC transformer, with the alternating current being electromagnetically transmitted by way of core coils 4, 5 operating as transmitters to an alternating current/direct current transformer 6 formed as a AC/DC transformer. The direct current voltage which thereby results supplies current to an oscillator 7 joined to a sensor. An evaluation stage 8 supplies a signal to a controllable current sink 9 in dependence upon the operational status of the oscillator 7 and thus on a proximity phase at the sensor. The current sink 9 functions as an encoder because it extracts a smaller or greater amount of current from the AC/DC transformer 6 in dependence upon a status of an approach guidance of the sensor. The differential extraction of current thereby works back to the current consumption of the DC/AC transformer 3. An information decoder 10 supplies a signal, derived from the value of a current consumption, to a switch step 11 which, in the illustrated embodiment is fashioned as, for example, a transistor. Consequently, the output signal of the proximity switch is adjacent to the terminal 12 since a collector-emitter span of the switch step 11 is either blocked or put through to the terminal 2.

As shown in phantom line, the proximity switch, in an area of a direct current circuit arrangement, is spatially separable by the DC/AC and the AC/DC transformers 3, 6 into a main part 13 and a sensor part 14. The electromagnetic coupling between the core coils 4, 5 make it possible for a transmission of energy from the main part 13 to the sensor part 14 and, at the same time, makes it possible for a signal transmission from the sensor part 14 to the main part 13 and, in the process, no electrical connections are required.

The arrangement according to the present invention for energy and signal transmission between the main part 13 and sensor part 14 of the proximity switches, as can readily be appreciated, is not limited to inductive proximity switches but rather can be applied in an identical fashion even for proximity switches with other sensors such as, for example, sensors operating as a result of a capacitive effect. Moreover, it is even possible in accordance with the present invention to fashion the main part 13 in such a manner that the sensor parts having different action or functioning principles can be selectively mounted on a main part.

As can also be appreciated, the arrangement of the present invention is not restricted to a circuit shown in FIG. 1 and other types of circuits with the division according to the present invention into a main part and sensor part can also be employed. The external connection for the supply of the proximity switch can also take place at an alternating current voltage source by way of, for example, a rectifier circuit. Moreover, instead of the switch step 11, other electrical switching devices such as, for example, thyristors or triacs can be used, or, for example, a relay may be utilized so that a defined contact point forms for output of the proximity switch. In situations in which the output of the proximity switch is not utilized for switching electrical loads, the load increment can be dispensed with an a voltage signal with defined phases provided by the encoder can form the output. Additionally, it is also possible for proximity switches known as so-called dual-wire constructions to be utilized in accordance with the principles of the present invention.

In the embodiments of FIGS. 2-8, the main part 13 of the proximity switch is accommodated in a base housing generally designated by the reference numeral 15 formed of a metallic or synthetic material with a cover 16 covering the housing. The main part 13 includes the electrical circuit with the connector for the external electrical contact of the proximity switch being in the form of a screw, plug, clamp, or soldered connection or by directly connected electrical lines. The core coil 4 (FIG. 4) is mounted in the base housing 15 on a housing wall 17 in which the sensor part 14 rests or is secured in a mounted condition. A dovetail suspension pocket is provided on the housing wall 17. The sensor part 14 is housed in a cube-shaped probe generally designated by the reference numeral 17 which is provided, on a fastening side thereof with a quadratic head shaped portion generally designated by the reference numeral 20, undercut on all sides, which can be inserted into the dovetail suspension pocket 18 in four different rotational positions. A threaded pressure plate 21 holds, in a mounted condition, the probe 19 firmly to the base housing 15, with the probe 19 including the core coil 5 on a wall which rests on the base housing 15 in a mounted condition. Moreover, the probe 19 additionally includes at least an appropriate sensor element such as, for example, a coil 22. In the embodiment of FIGS. 2-5, the fastening side of the probe 19 and, consequently, the core coil 5 lie against the side of the cube which is opposite to the sensor coil 22 and thus to the response side.

After the pressure plate 21 is released, the probe 19 can be easily replaced without having to break or establish electrical connections and without thereby making electrical or sensitive mechanical parts accessible. The protection against contaminants such as dust and moisture also remains completely intact. Since no electrical parts are accessible, it is possible by virtue of the features of the present invention to carry out a replacement even when the main part is electrically active or switched on.

While a replacement of the probe 19 of the embodiment of FIGS. 2-5 only makes sense when the probe 19 is supposed to be exchanged for one having other characteristics, FIG. 6 provides an example of a probe in which the core coil 5 rests against a cube side adjacent to a response side and/or sensor coil 22 so that the probe 23 permits itself to be applied to the base housing 15 in four different alignments of an associated sensor coil 22.

Figure 7:
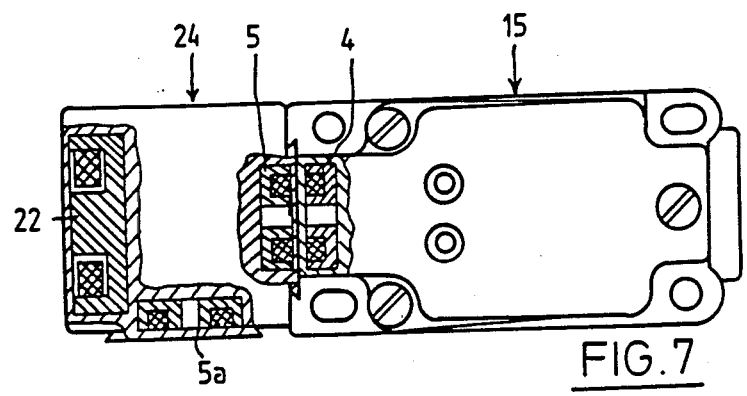
FIG. 7 is a partial cross-sectional view of a further embodiment constructed in accordance with the present invention.
Figure 8:
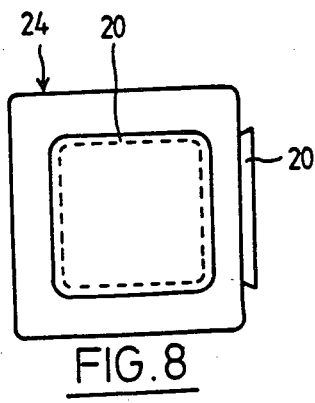
FIG. 8 is a front view of the embodiment of FIG. 7.

FIGS. 7 and 8 provide an example of a probe which has, both on the side opposite as well as on a side adjacent to the sensor coil 22 one quadratic insertion head 20 each for the dovetail suspension pocket 18 and one core coil 5, 5a each of which are both attached to the alternating current/direct current transformer 6 of the sensor part 14 (FIG. 1). The probe 24 is adapted to be fitted with the response side arranged selectively axially or in one of four transverse directions relative to the longitudinal axis of the proximity switch.

While we have shown and described several embodiments in accordance with the present invention, it is uderstood that the same is not limited thereto but is susceptible to numerous changes and modifications as known to one of ordinary skill in the art, and we therefore do not wish to be limited to the details shown and described herein but intend to cover all such modifications as are encompassed by the scope of the appended claims.

We claim:

1. A non-contract proximity switch, with a direct current circuit arrangement lying between an input portion and a sensor field producing means including a terminal-side main portion set in a base housing and a sensor portion arranged in a probe, said probe being adapted to be selectively set in different predetermined positions on the base housing of the main portion for enabling a selection of a response direction, means for insulating the probe on all sides thereof, said main portion includes a direct current/alternating current transformer with a core coil, the sensor portion includes an alternating current/direct current transformer with an added core coil, and wherein the core coils are disposed behind both a fastening side of the base housing and the probe whereby, when the probe is released from inductive coupling, energy carries over from the main portion to the sensor portion and provides output signals from the sensor portion to the main portion, said probe is cube-shaped and includes a fastening side adjacent a response side thereof and fastening side disposed in opposition to the response side, and wherein a core coil is mounted on each of the fastening sides, with the core coils being attached to the same alternating current-/direct current transformer 2. A proximity switch according to claim 1, wherein the base housing of the main portion is provided with a dovetail pocket on the fastening side, and said probe includes a quadratically shaped head on at least one of the sides of the cube-shaped probe, said quadratically shaped head being undercut on all sides and being adapted to be inserted into the dovetail pocket.

3. A proximity switch according to claim 2, wherein pressure plate means are provided for closing an open end of the dovetail pocket.

* * * * *

UNITED STATES PATENT AND TRADEMARK OFFICE
CERTIFICATE OF CORRECTION

PATENT NO. : 4,757,213
DATED : July 12, 1988
INVENTOR(S) : Burkhard TIGGES, Dierk BRASSE It is certified that error appears in the above-identified patent and that said Letters Patent is hereby corrected as shown below:

On TITLE page, left-hand column, after "(73) Assignee:" the name "Werner Turch GmbH & Co. KG" should read --Werner Turck GmbH & Co. KG--.

Signed and Sealed this

Thirty-first Day of October, 1989

Attest:

DONALD J. QUIGG

*Attesting Officer*   *Commissioner of Patents and Trademarks*